(12) United States Patent
Kawabata et al.

(10) Patent No.: US 8,837,164 B2
(45) Date of Patent: Sep. 16, 2014

(54) SUBSTRATE FOR MOUNTING DEVICE AND PACKAGE FOR HOUSING DEVICE EMPLOYING THE SAME

(75) Inventors: Kazuhiro Kawabata, Higashioumi (JP); Kiyoshige Miyawaki, Kyoto (JP); Yoshiaki Ueda, Higashioumi (JP); Shinji Nakamoto, Higashioumi (JP); Tsutomu Sugimoto, Higashioumi (JP)

(73) Assignee: Kyocera Corporation, Kyoto (JP)

( * ) Notice: Subject to any disclaimer, the term of this patent is extended or adjusted under 35 U.S.C. 154(b) by 521 days.

(21) Appl. No.: 12/865,107

(22) PCT Filed: Jan. 22, 2010

(86) PCT No.: PCT/JP2010/050809
§ 371 (c)(1),
(2), (4) Date: Jul. 28, 2011

(87) PCT Pub. No.: WO2010/084955
PCT Pub. Date: Jul. 29, 2010

(65) Prior Publication Data
US 2011/0273846 A1 Nov. 10, 2011

(30) Foreign Application Priority Data

Jan. 22, 2009 (JP) ................................. 2009-011751
Apr. 23, 2009 (JP) ................................. 2009-105165

(51) Int. Cl.
*H05K 7/02* (2006.01)
*H01L 23/367* (2006.01)
*H01L 23/36* (2006.01)
*H01L 23/057* (2006.01)

(52) U.S. Cl.
CPC ............. *H01L 23/3675* (2013.01); *H01L 23/36* (2013.01); *H01L 23/057* (2013.01); *H01L 2924/09701* (2013.01)

USPC ........... 361/807; 361/704; 361/705; 361/760; 174/559; 257/665; 257/676; 257/692; 257/788; 438/126; 29/827

(58) Field of Classification Search
CPC ............. H05K 7/02; H05K 7/06; H05K 7/20; H05K 13/02; H03H 9/05; H03H 9/10; H01L 21/00; H01L 21/02; H01L 21/48; H01L 21/50; H01L 21/70; H01L 23/02; H01L 23/34; H01L 23/37; H01L 23/48; G01R 31/01
USPC .................. 361/807, 704, 705, 760; 174/559; 257/665, 676, 692, 788; 438/126; 29/827
See application file for complete search history.

(56) References Cited

U.S. PATENT DOCUMENTS

| | | | | |
|---|---|---|---|---|
| 4,354,720 A * | 10/1982 | Bakermans | ................... | 439/357 |
| 4,620,216 A * | 10/1986 | Horvath | ....................... | 257/713 |
| 4,965,227 A * | 10/1990 | Chang et al. | .................. | 29/827 |
| 5,144,412 A * | 9/1992 | Chang et al. | .................. | 257/665 |
| 5,158,912 A * | 10/1992 | Kellerman et al. | ........... | 438/126 |
| 5,206,460 A * | 4/1993 | Yang | ............................ | 174/559 |
| 5,347,159 A * | 9/1994 | Khandros et al. | ............. | 257/692 |
| 5,378,970 A * | 1/1995 | Sato | ......................... | 324/756.02 |
| 5,736,787 A * | 4/1998 | Larimer | ........................ | 257/732 |
| 5,814,880 A * | 9/1998 | Costello et al. | ............... | 257/678 |
| 5,930,666 A * | 7/1999 | Pankove | ...................... | 438/615 |
| 6,169,330 B1 * | 1/2001 | Pankove | ....................... | 257/782 |
| 6,239,487 B1 | 5/2001 | Park et al. | ..................... | 257/712 |
| 6,292,367 B1 * | 9/2001 | Sikka et al. | ................... | 361/705 |
| 6,740,961 B1 * | 5/2004 | Mostafazadeh | ............... | 257/676 |
| 6,933,175 B2 * | 8/2005 | Lo et al. | ........................ | 438/122 |
| 7,643,297 B2 * | 1/2010 | Tominaga et al. | ............ | 361/704 |
| 2002/0135429 A1 * | 9/2002 | Akagawa et al. | ............... | 331/68 |
| 2005/0035447 A1 | 2/2005 | Basho et al. | ................... | 257/712 |
| 2005/0110168 A1 * | 5/2005 | Chuang | ......................... | 257/788 |
| 2005/0135758 A1 * | 6/2005 | Sato et al. | ..................... | 385/92 |
| 2005/0174744 A1 * | 8/2005 | Zheng | ........................... | 361/760 |
| 2007/0089511 A1 * | 4/2007 | Sasaki | ......................... | 73/514.16 |
| 2008/0130935 A1 * | 6/2008 | Sato et al. | ..................... | 381/361 |
| 2010/0019379 A1 * | 1/2010 | Zhao et al. | ..................... | 257/713 |
| 2010/0020469 A1 * | 1/2010 | Kurioka et al. | ............. | 361/321.1 |
| 2010/0117099 A1 * | 5/2010 | Leung | ............................ | 257/88 |
| 2010/0155748 A1 * | 6/2010 | Chan et al. | ...................... | 257/89 |

FOREIGN PATENT DOCUMENTS

| | | |
|---|---|---|
| JP | 11111898 A | 4/1999 |
| JP | 11-260987 | 9/1999 |
| JP | 2004-296726 | 10/2004 |
| JP | 2005-032881 | 2/2005 |
| JP | 2006-294890 | 10/2006 |
| JP | 2008041756 A | 2/2008 |
| JP | 2008-135511 | 6/2008 |

OTHER PUBLICATIONS

Japanese language office action dated Aug. 20, 2013 and its English language Statement of Relevance of Non-English References Pursuant to 37 CFR 1.98(a)(3)(i) issued in corresponding Japanese application 2010527686.

* cited by examiner

*Primary Examiner* — Xiaoliang Chen

(74) *Attorney, Agent, or Firm* — DLA Piper LLP (US)

(57) ABSTRACT

There are provided a substrate for mounting a device and a package for housing the device employing the same in which a power semiconductor device can be readily set for a temperature suitable for operation and can thus function in a proper fashion.

The substrate for mounting the device includes a support body having, on one main surface of the support body, a device mounting portion for mounting a power semiconductor device, the support body having a plurality of columnar parts that are spaced apart in a thickness direction with respect to the device mounting portion and are arranged apart from each other; and a heat accumulating region which is disposed between the columnar parts and is lower in thermal conductivity than the support body.

6 Claims, 8 Drawing Sheets

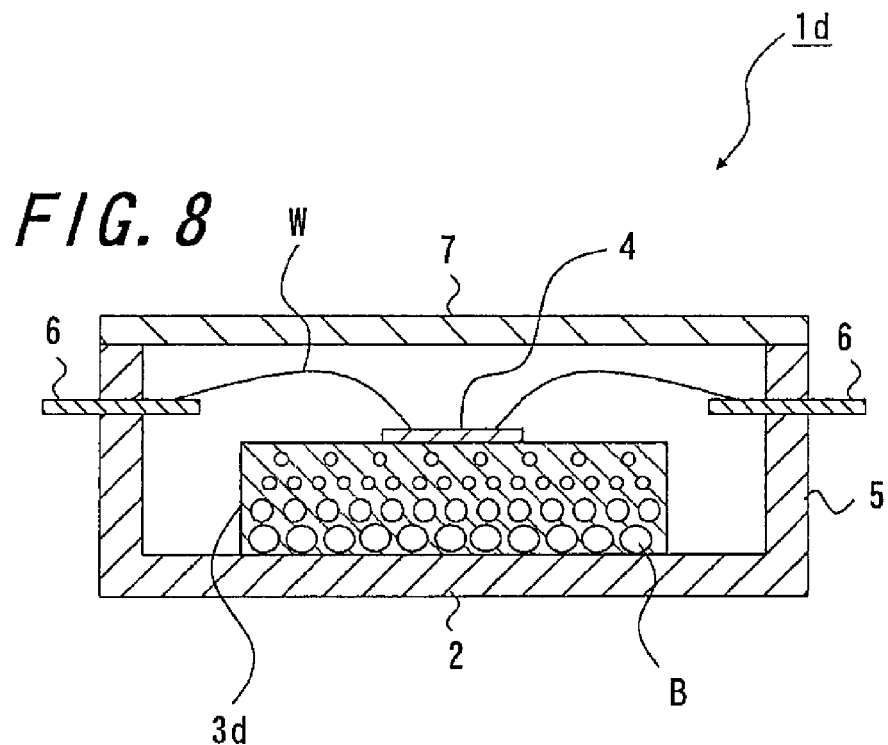
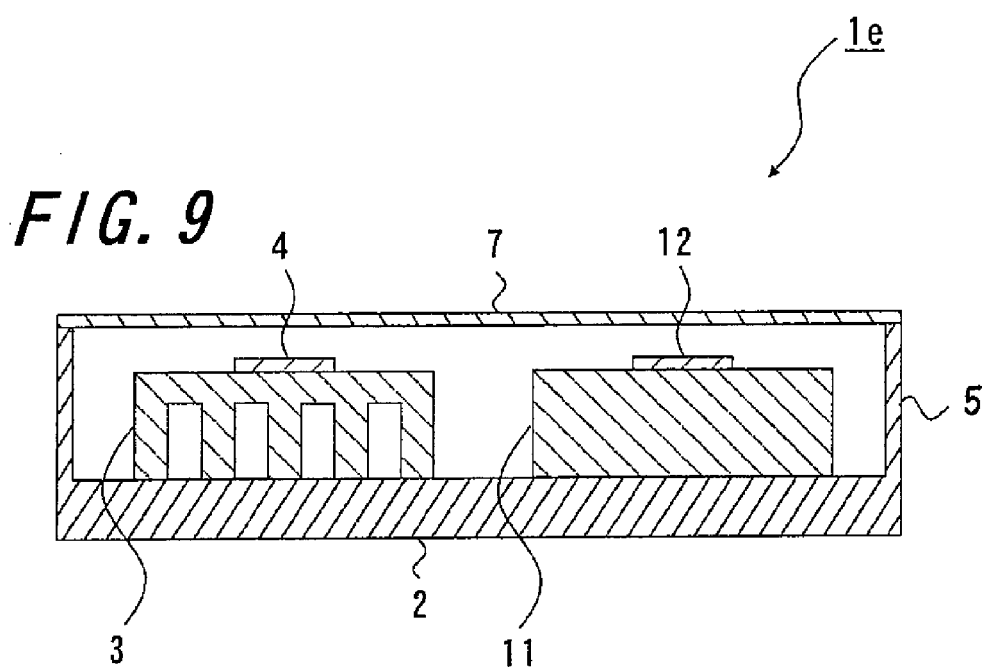

→ ROUTE OF HEAT

SUBSTRATE FOR MOUNTING DEVICE AND PACKAGE FOR HOUSING DEVICE EMPLOYING THE SAME

CROSS-REFERENCE TO THE RELATED APPLICATIONS

This application is a national stage of international application No. PCT/JP2010/050809, filed on Jan. 22, 2010, and claims the benefit of priority under 35 USC 119 to Japanese Patent Application No. 2009-011751, filed on Jan. 22, 2009 and Japanese Patent Application No. 2009-105165, filed on Apr. 23, 2009, the entire contents of all of which are incorporated herein by reference.

TECHNICAL FIELD

The present invention relates to a substrate for mounting a device adapted to mount a power semiconductor device, and a package for housing the device employing the substrate.

BACKGROUND ART

While a silicon (Si) single crystal is widely used as a material of a semiconductor device, there have recently been developed semiconductor devices in which a highly heat-resistant semiconductor material such as silicon carbide (SiC), gallium nitride (GaN), and diamond is used (for example, refer to Patent document 1). These semiconductor devices are lower in transport current loss and are higher in switching frequency than a conventional Si-made semiconductor device. Moreover, temperatures suitable for operating a semiconductor device made of such a heat-resistant material properly (hereafter referred to as "operating temperatures") are higher than the operating temperatures of an Si-made semiconductor device (approximately 15° C. to 120° C.) (the operating temperatures of an SiC-made semiconductor device: approximately 300° C. to 500° C.). It is therefore to be expected that a semiconductor device made of such a heat-resistant material will be utilized as a power semiconductor device through which a large electric current passes.

However, since such a highly heat-resistant semiconductor device is higher than a conventional Si-made semiconductor device in terms of operating temperature range, when it is housed in a conventional package before use, it will be very difficult to set the internal temperature of the package at the operating temperature of the semiconductor device. Hence, a new-type package has been sought after that can be readily set for a range of temperatures at which a highly heat-resistant semiconductor device can be operated in a proper fashion.

SUMMARY OF THE INVENTION

A substrate for mounting a device in accordance with one embodiment of the invention comprises a support body having, on one main surface of the support body, a device mounting portion for mounting a power semiconductor device, the support body having a plurality of columnar parts that are spaced apart in a thickness direction with respect to a mounting surface and are arranged apart from each other; and a heat accumulating region which is disposed between the columnar parts and is lower in thermal conductivity than the support body.

A substrate for mounting a device in accordance with one embodiment of the invention comprises the support body mentioned above; and a base body bonded to a lower surface of the support body, the support body having a plurality of pores formed therein.

A package for housing the device in accordance with one embodiment of the invention comprises the substrate mentioned above; a frame body which accommodates therein the substrate and is so placed as to surround the power semiconductor device; and a lid body bonded to an upper surface of the frame body.

According to the substrate for mounting the device and the package for housing the device thus far described, it is possible to afford advantages that the power semiconductor device can be readily set for a temperature suitable for operation and can thus function in a proper fashion.

BRIEF DESCRIPTION OF DRAWINGS

FIG. 8 is a sectional view showing one example of a package for housing a device in accordance with a modified-form example 4;

FIG. 9 is a sectional view showing one example of a package for housing a device in accordance with a modified-form example 5;

DESCRIPTION OF EMBODIMENTS

Hereinafter, an embodiment of the invention will be described with reference to the drawings.

Figure 1:
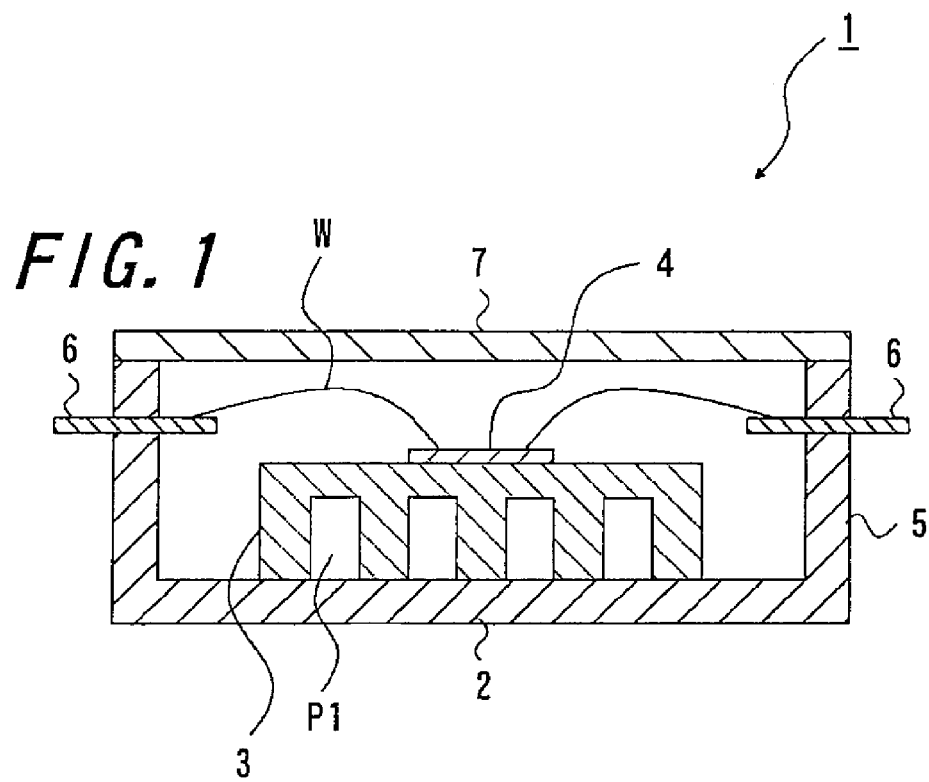
FIG. 1 is a sectional view showing one example of a package for housing a device in accordance with one embodiment of the invention.
Figure 2:
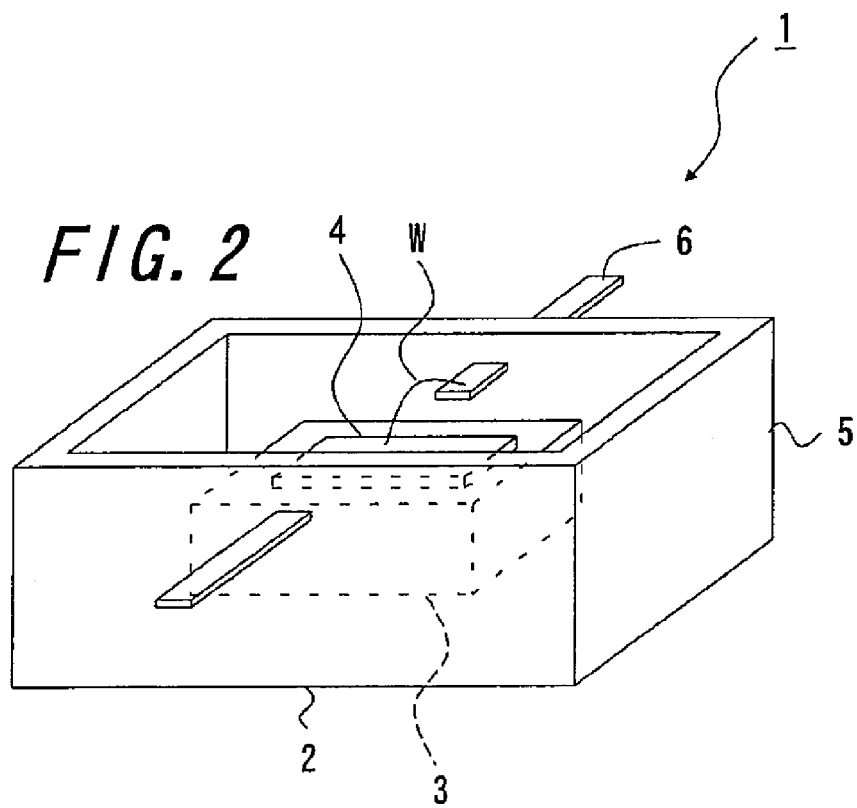
FIG. 2 is a perspective view showing one example of the package for housing the device.

As shown in FIGS. 1 and 2, a package for housing a device 1 in accordance with this embodiment comprises a base body 2, a support body 3, a power semiconductor device 4, a frame body 5, power supply terminals 6, and a lid body 7. Note that a diagrammatic representation of the lid body 7 is omitted in FIG. 2. Herein, the support body 3 and the power semiconductor device 4 constitute one embodiment of a substrate for mounting a device according to the invention.

The base body 2 is made, for example, of a ceramic material, a metal material, a glass material, a highly heat-resistant resin material, or the like. Examples of the ceramic material include an aluminum oxide sintered compact, a mullite sintered compact, a silicon carbide (SiC) sintered compact, an aluminum nitride sintered compact, a silicon nitride sintered compact, and glass ceramics. Moreover, examples of the metal material include a Fe-based alloy, oxygen free copper, and SUS. Further, examples of the glass material include borosilicate glass and quartz glass. Still further, examples of the highly heat-resistant resin material include polyimide.

The support body 3 is bonded to an upper surface of the base body 2. Moreover, the power semiconductor device 4 is bonded to an upper surface of the support body 3 (to be specific, a main surface of a device mounting portion 31 which will hereafter be described). Although, in this embodiment, the power semiconductor device 4 is an SiC-made semiconductor device, it is not limited thereto but may be a semiconductor device constructed by using silicon, gallium nitride, diamond, or the like. That is, there is no particular limitation to the type of the power semiconductor device 4 according to the invention. Note that, in the power semiconductor device 4 in general, its operating temperatures are so set as to fall within a range of 200° C. or above and 500° C. or below.

Herein, the support body 3 related to the present embodiment supports the power semiconductor device 4, and also has the capability of dissipating heat generated from the power semiconductor device 4 to the outside while effecting heat insulation. For example, the support body 3 is made of a ceramic material, a metal material, or the like. Examples of the ceramic material include an aluminum oxide sintered compact, a mullite sintered compact, a silicon carbide sintered compact, an aluminum nitride sintered compact, a silicon nitride sintered compact, and glass ceramics. Moreover, examples of the metal material include a copper-tungsten composite material, a copper-molybdenum composite material, and copper.

Figure 3:
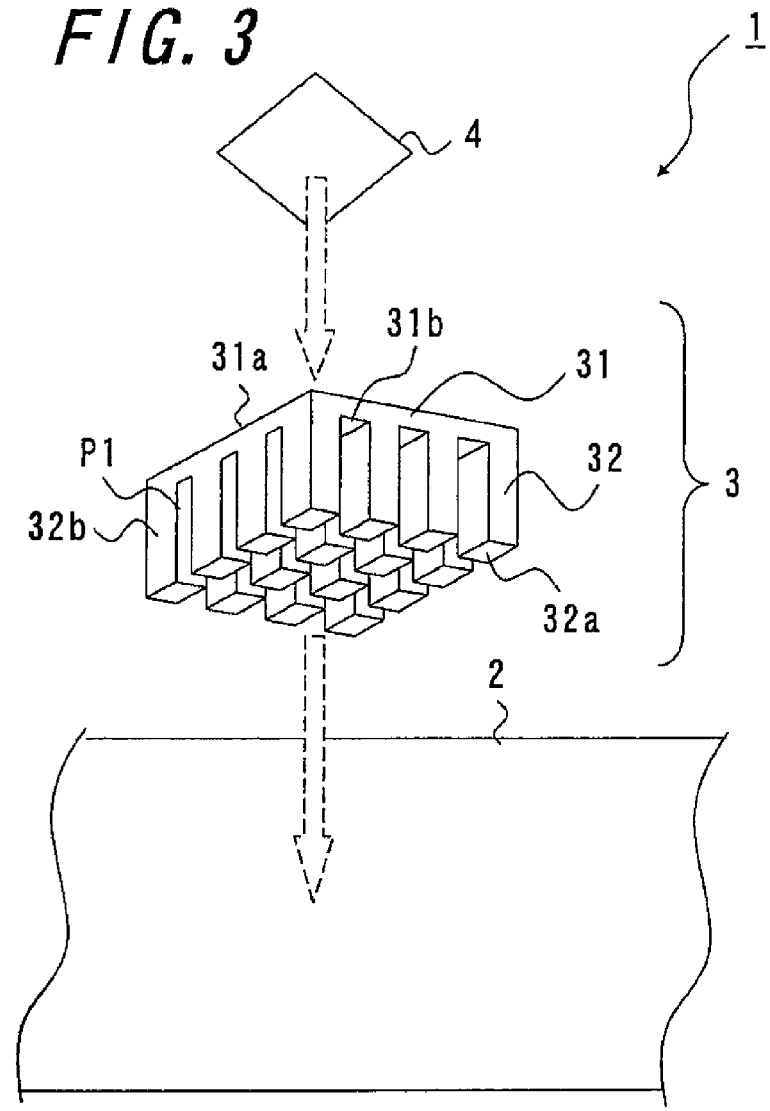
FIG. 3 is an exploded perspective view showing a support body employed in the package for housing the device.

As shown in FIG. 3, the support body 3 includes a device mounting portion 31 having a columnar part 32. The device mounting portion 31 is a member having a main surface (one surface) 31a on which the power semiconductor device 4 is to be mounted. That is, the power semiconductor device 4 is mounted on the main surface 31a of the device mounting portion 31. In this way, heat generated from the power semiconductor device 4 can be diffused by the flat plate-shaped device mounting portion 31. Moreover, there are provided a plurality of columnar parts 32 that are each so formed as to jut out from a back surface (the other surface) 31b of the device mounting portion 31. Further, the base body 2 is bonded to lower surfaces 32a of the plurality of columnar parts 32. Note that the distance between the columnar parts 32, the length of the columnar part 32, the number of the columnar parts 32, etc. are determined arbitrarily in an appropriate manner with consideration given to the type of the power semiconductor device 4, device usage, and so forth. A space P1 is located between the columnar parts 32.

Since the columnar part 32 is greater in thermal conductivity than the space P1, it follows that a heat accumulating region whose thermal conductivity is lower than that of the columnar part 32 is present between the adjacent columnar parts 32. Note that, for example, the thermal conductivity of the columnar part 32 is set to fall within a range of 1 W/(m·K) or above and 400 W/(m·K) or below.

Moreover, in order to reduce the amount of heat traveling from the columnar part 32 toward the base body 2 so that the power semiconductor device 4 can be operated within the range of operating temperatures, as a bonding material for connecting the lower surface 32a of the columnar part 32 and the base body 2, for example, a silver-copper brazing material, gold-germanium solder, a ceramic adhesive, a highly heat-resistant resin adhesive, or the like is used.

As for the heat generated from the power semiconductor device 4, while most part of the heat can be transferred from the upper area of the support body 3 through the lower-located columnar parts 32 to the base body 2 successfully, a part of the heat tends to be transferred into the space P1 from the upper area of the support body 3 with consequent confinement of the heat in the space P1. Therefore, in a region near the power semiconductor device 4, by decreasing the temperature of the support body 3, it is possible to restrain the power semiconductor device 4 from acquiring an unduly high temperature. Moreover, in a region spaced away from the power semiconductor device 4, namely, in a region near the space P1 located between the columnar parts 32, satisfactory heat accumulation can be achieved by exploiting heat generated from the power semiconductor device 4. This makes it possible to successfully suppress too large a drop in the internal temperature of the package, as well as to successfully restrain heat emanating from the package from affecting operations of other electronic components arranged around the package.

It is noted that such a package for housing the device is used as a component of various electronic apparatuses including an inverter of a household electrical appliance and a power converter for use in a power plant and a substation, for example.

The frame body 5 is disposed on the upper surface of the base body 2 so as to surround the support body 3 and the power semiconductor device 4. Herein, the frame body 5 is made for example of a ceramic material, a metal material, a glass material, a highly heat-resistant resin material, or the like. Note that the frame body 5 may be either formed integrally with the base body 2 or formed separately from the base body 2. In a case where the frame body 5 is formed separately from the base body 2, the frame body 5 and the base body 2 are bonded together by means of a bonding material such as solder or a brazing material, for example.

The power supply terminal 6 is a terminal for delivering electric power to the power semiconductor device 4. Accordingly, the power supply terminal 6 is electrically connected to the power semiconductor device 4 via a wire (bonding wire) W.

The lid body 7 is bonded to an upper surface of the frame body 5. More specifically, the lid body 7 is bonded to the upper surface of the frame body 5 by means of a bonding material such as solder, a brazing material, or the like, in such a manner that a housing space created by the frame body 5 for accommodating therein the power semiconductor device 4 can be an enclosed space under an aerial atmosphere, an inert gas atmosphere, or a vacuum state.

As described heretofore, according to the substrate for mounting the device and the package for housing the device 1 employing this substrate in accordance with the present embodiment, it is possible to dissipate heat generated from the power semiconductor device 4 while effecting heat insulation with a simple structure. As a result, the substrate for mounting the device and the package for housing the device 1 employing this substrate in accordance with the present embodiment afford the advantage of being able to make effective use of heat generated from the power semiconductor device within the range of operating temperatures of the power semiconductor device.

Figure 4:
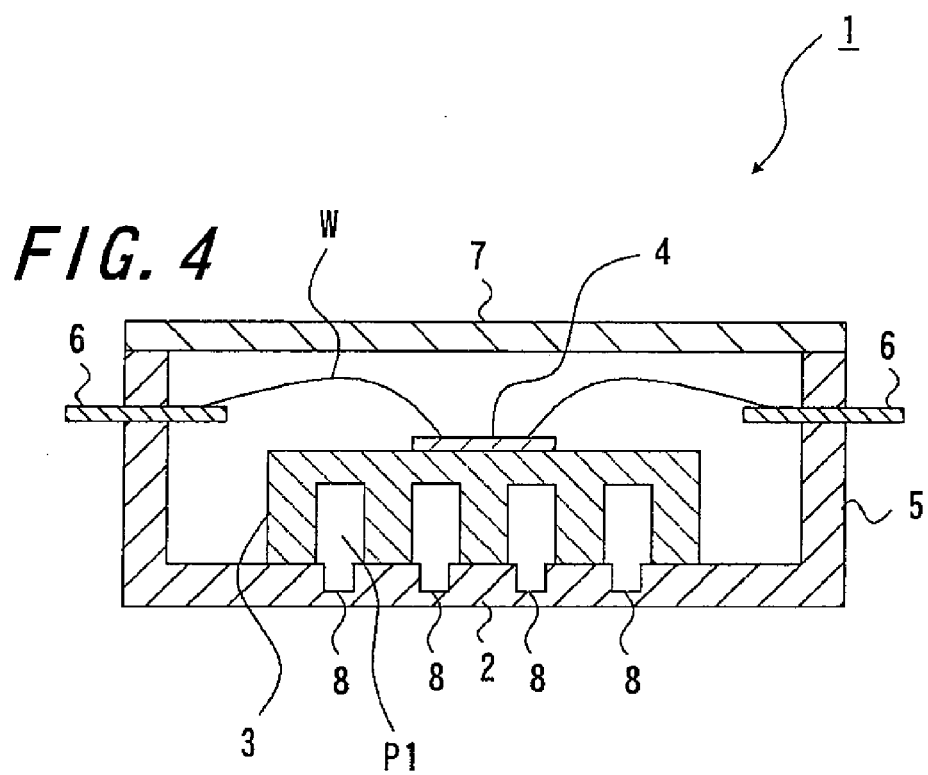
FIG. 4 is a sectional view showing one example of the package for housing the device as seen in a case where a notch is formed in that part of a base body which is located between columnar parts.

It is noted that, even in the construction thus far described, depending on the type of the power semiconductor device 4, device usage, and so forth, there is a possibility that the temperature of the power semiconductor device 4 will exceed the operating temperatures. In light of this, as shown in FIG. 4, a notch 8 is formed in an area of the base body 2 which is located between the columnar parts 32. This makes it possible to facilitate the escape of heat confined in the space P1 between the columnar parts 32 from the notch 8-bearing area of the base body 2 to the outside, and thereby lower the temperature of heat generated from the power semiconductor device 4. That is, the notch 8-bearing area of the base body 2 is smaller in thickness than the area thereof devoid of the notch 8. In fact, even in the construction as shown in FIG. 4, it is possible to dissipate heat generated from the power semiconductor device 4 while effecting heat insulation with a simple structure. Note that the depth of the notch 8, the number of the notches 8, etc. are determined arbitrarily in an appropriate manner with consideration given to the type of the power semiconductor device 4, device usage, and so forth.

Moreover, although the above description deals with the case where only a single power semiconductor device 4 is placed inside the package for housing the device 1, the invention is not so limited. That is, the number of the power semiconductor device 4 to be placed inside the package for housing the device 1 can be determined arbitrarily. Accordingly, a plurality of support bodies 3 and a plurality of power semiconductor devices 4 attached respectively to the support bodies 3 can be placed inside the package for housing the device 1, and also a single support body 3 and a plurality of power semiconductor devices 4 attached to this support body 3 can be placed inside the package for housing the device 1.

It is noted that the above-described embodiment is presented for purposes of illustration of one specific example of embodiments of the invention, and therefore various changes and modifications may be made therein. Hereafter, examples of a few main modified forms will be presented.

Modified-Form Example 1

Figure 5:
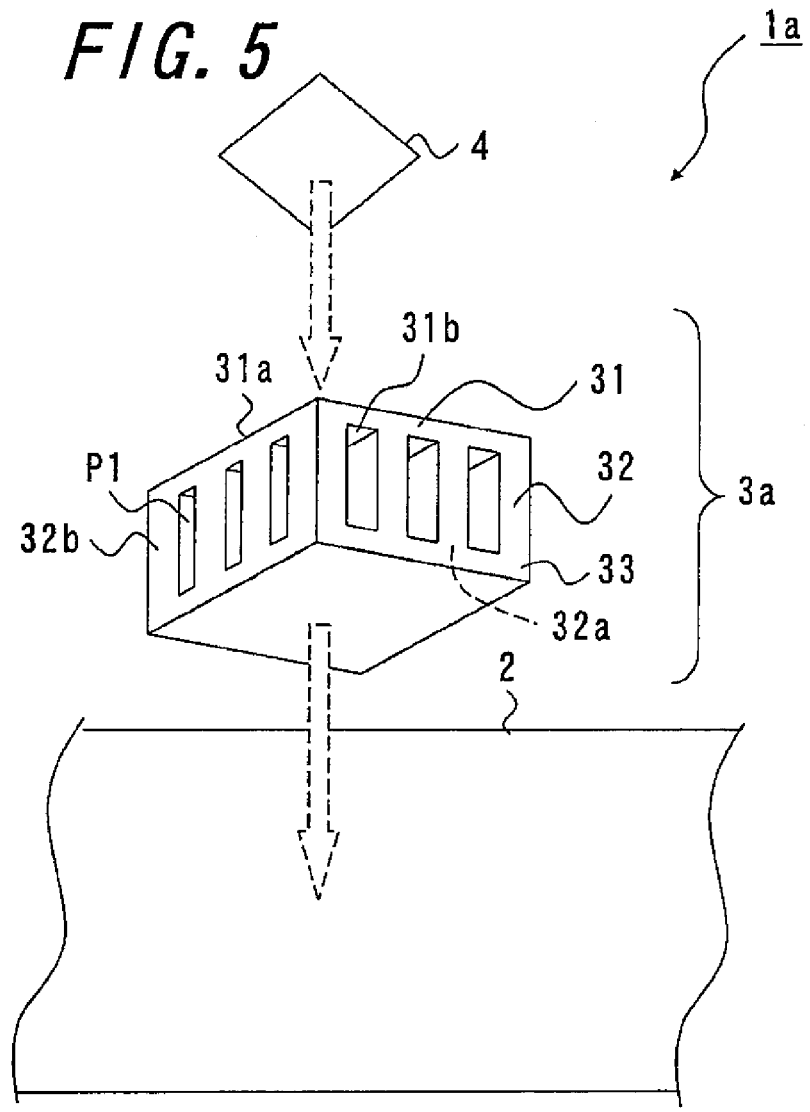
FIG. 5 is an exploded perspective view showing a support body related to a modified-form example 1.

By way of the above-described embodiment, as shown in FIG. 3, the substrate for mounting the device is described comprising the device mounting portion 31 having the main surface 31*a* on which the power semiconductor device 4 is to be mounted, the plurality of the columnar parts 32 formed so as to jut out from the back surface 31*b* of the device mounting portion 31, and the base body 2 bonded to the lower surfaces 32*a* of the plurality of the columnar parts 32. Even in this construction, however, depending on the type of the power semiconductor device 4, device usage, and so forth, there may be a case where heat generated from the power semiconductor device 4 is dissipated to excess. In light of this, a substrate for mounting a device 1*a* in accordance with a modified-form example 1 will be explained. As shown in FIG. 5, in this example, a support body 3*a* includes a bottom plate 33 which is connected to the lower surfaces 32*a* of the plurality of columnar parts 32. Note that, in FIG. 5, the components that are similar in function to those in FIG. 3 will be identified with the same reference symbols, and detailed descriptions thereof will be omitted.

As shown in FIG. 5, the support body 3*a* related to the modified-form example 1 comprises a device mounting portion 31, columnar parts 32, and a bottom plate 33. The device mounting portion 31 is a member having a main surface 31*a* on which the power semiconductor device 4 is to be mounted. Moreover, there are provided the plurality of columnar parts 32 that are each so formed as to jut out from a back surface 31*b* of the device mounting portion 31. Further, the bottom plate 33 is connected to the lower surfaces 32*a* of the plurality of columnar parts 32. Still further, the base body 2 is bonded to the bottom plate 33.

Thus, according to the substrate for mounting the device and the package for housing the device 1*a* employing this substrate in accordance with the modified-form example 1, since the lower surfaces 32*a* of the plurality of columnar parts 32 and the bottom plate 33 are connected to each other and also the bottom plate 33 and the base body 2 are bonded to each other, it never occurs that heat generated from the power semiconductor device 4 is directly transmitted to the base body 2. Therefore, as compared with the preceding embodiment, in this example, heat generated from the power semiconductor device 4 can be confined more readily in the space P1 between the columnar parts 32 (namely, a region between the device mounting portion 31 and the bottom plate 33). Moreover, according to the substrate for mounting the device and the package for housing the device 1*a* employing this substrate in accordance with the modified-form example 1, since there are provided the plurality of columnar parts 32, it is possible to cause heat generated from the power semiconductor device 4 to dissipate from lateral surfaces 32*b* of the plurality of columnar parts 32. Further, heat generated from the power semiconductor device 4 can be dissipated also from the base body 2 bonded to the bottom plate 33. In this way, according to the substrate for mounting the device and the package for housing the device 1*a* employing this substrate in accordance with the modified-form example 1, it is possible to insulate heat generated from the power semiconductor device 4 more positively than may be the case of the preceding embodiment while dissipating the heat to a certain extent.

Modified-Form Example 2

Figure 6:
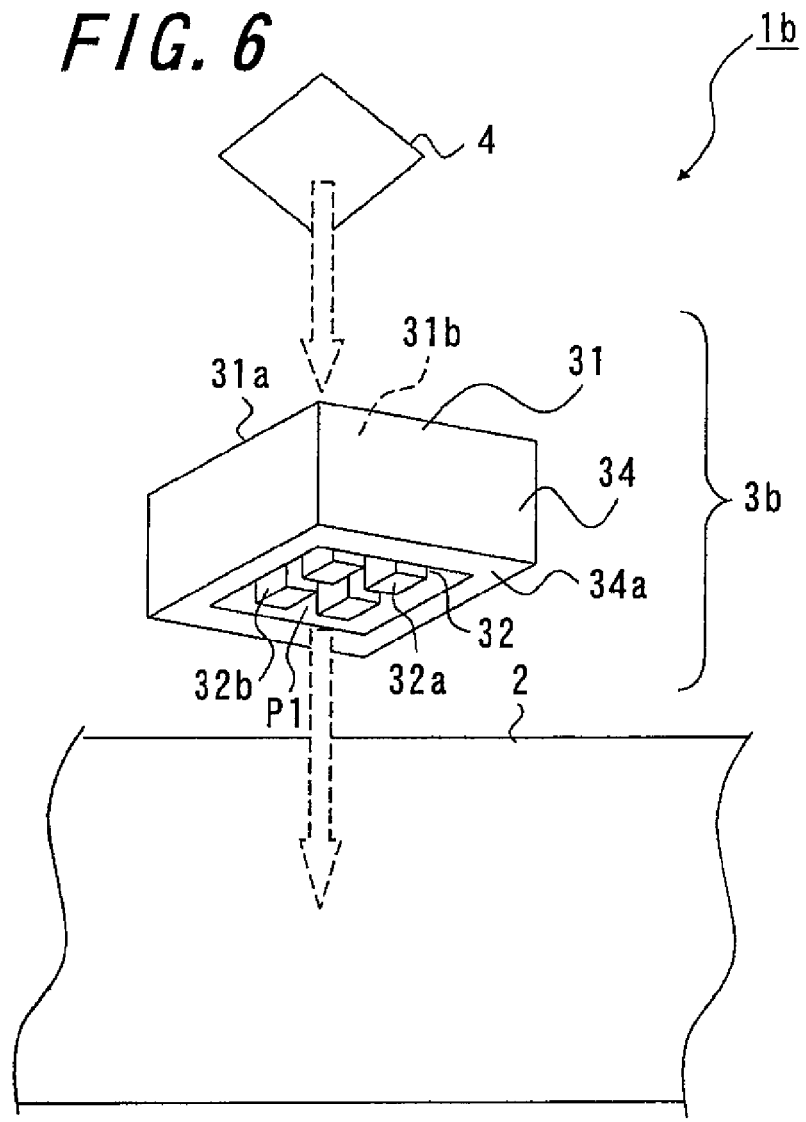
FIG. 6 is an exploded perspective view showing a support body related to a modified-form example 2.

By way of the above-described modified-form example 1, as shown in FIG. 5, the substrate for mounting the device is described comprising the flat plate-shaped device mounting portion 31 having the main surface 31*a* on which the semiconductor device 4 is to be mounted, the plurality of columnar parts 32 formed so as to jut out from the back surface 31*b* of the device mounting portion 31, the bottom plate 33 connected to the lower surfaces 32*a* of the plurality of columnar parts 32, and the base body 2 bonded to the bottom plate 33. Even in this construction, however, depending on the type of the power semiconductor device 4, device usage, and so forth, there may be a case where heat generated from the power semiconductor device 4 is dissipated to excess. In light of this, in a substrate for mounting a device 1*b* in accordance with a modified-form example 2, as shown in FIG. 6, a support body 3*b* includes a surrounding portion which is connected to a back surface 31*b* of a device mounting portion 31 so as to surround the plurality of columnar parts 32. Herein, as exemplary of the surrounding portion, a lateral plate 34 will be explained. Note that, in FIG. 6, the components that are similar in function to those in FIG. 3 will be identified with the same reference symbols, and detailed descriptions thereof will be omitted.

As shown in FIG. 6, the support body 3*b* related to the modified-form example 2 comprises a device mounting portion 31, columnar parts 32, and a lateral plate 34. The device mounting portion 31 is a member having the main surface 31*a* on which the power semiconductor device 4 is to be mounted. Moreover, there are provided the plurality of columnar parts 32 that are each so formed as to jut out from the back surface 31*b* of the device mounting portion 31. Further, the lateral plate 34 is connected to the back surface 31*b* of the device mounting portion 31 so as to surround the plurality of columnar parts 32. Still further, the base body 2 is bonded to the lower surfaces 32*a* of the plurality of columnar parts 32 and a lower surface 34*a* of the lateral plate 34 as well.

Thus, according to the substrate for mounting the device and the package for housing the device 1*b* employing this substrate in accordance with the modified-form example 2, there is provided the lateral plate 34 connected to the back surface 31*b* of the device mounting portion 31 so as to surround the plurality of columnar parts 32. Therefore, as compared with the modified-form example 1, in this example, heat generated from the power semiconductor device 4 can be confined more readily in the space P1 between the columnar parts 32 (namely, a region between the device mounting portion 31 and the base body 2). Moreover, according to the substrate for mounting the device and the package for housing the device 1b employing this substrate in accordance with the modified-form example 2, heat generated from the power semiconductor device 4 can be dissipated from the lateral plate 34 and the base body 2. In this way, according to the substrate for mounting the device and the package for housing the device 1b employing this substrate in accordance with the modified-form example 2, it is possible to insulate heat generated from the power semiconductor device 4 more positively than may be the case of the modified-form example 1 while dissipating the heat to a certain extent.

Modified-Form Example 3

Figure 7:
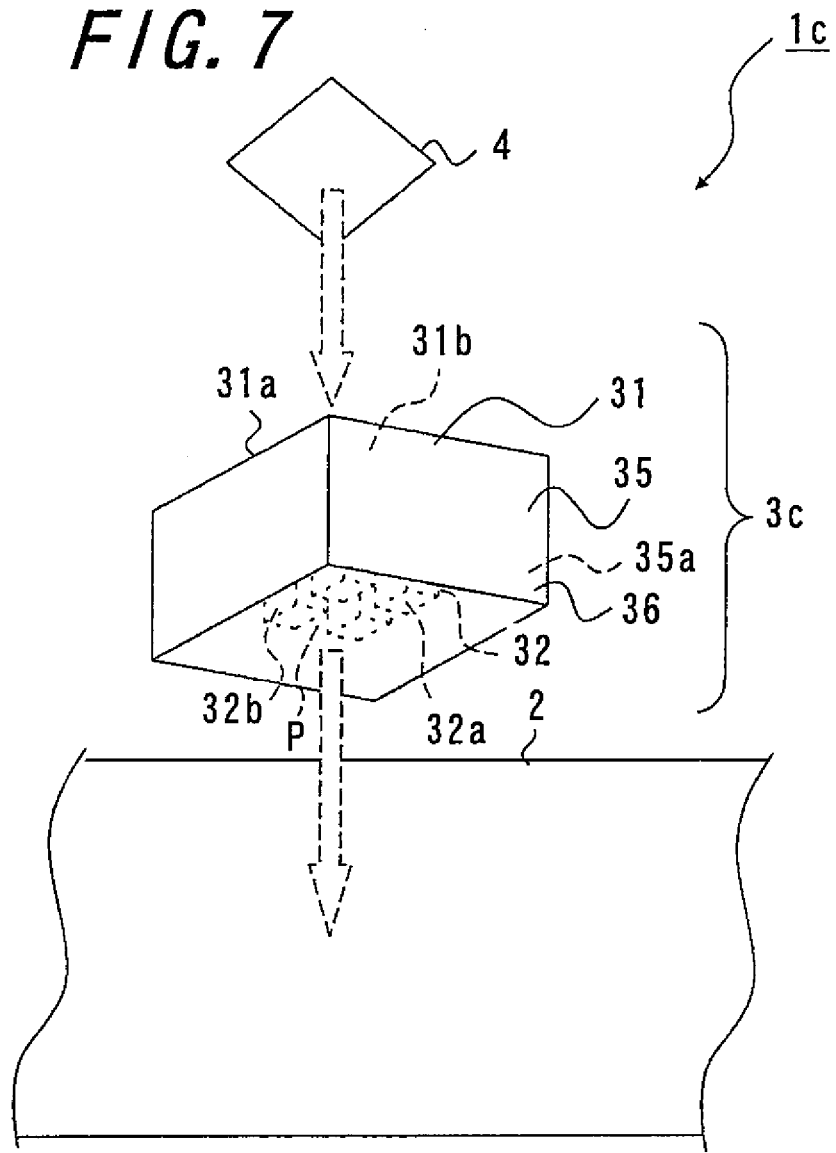
FIG. 7 is an exploded perspective view showing a support body related to a modified-form example 3.

By way of the above-described modified-form example 2, as shown in FIG. 6, the substrate for mounting the device is described comprising the flat plate-shaped device mounting portion 31 having the main surface 31a on which the power semiconductor device 4 is to be mounted, the plurality of columnar parts 32 formed so as to jut out from the back surface 31b of the device mounting portion 31, the lateral plate 34 connected to the back surface 31b of the device mounting portion 31 so as to surround the plurality of columnar parts 32, and the base body 2 bonded to the lower surfaces 32a of the plurality of columnar parts 32 and the lower surface 34a of the lateral plate 34 as well. Even in this construction, however, depending on the type of the power semiconductor device 4, device usage, and so forth, there may be a case where heat generated from the power semiconductor device 4 is dissipated to excess. In light of this, a substrate for mounting a device 1c in accordance with a modified-form example 3 will be explained. As shown in FIG. 7, in this example, a support body 3c includes a bottom plate 36 which is connected to the lower surfaces 32a of the plurality of columnar parts 32 and a lower surface 35a of a lateral plate 35 as well. Note that, in FIG. 7, the components that are similar in function to those in FIG. 3 will be identified with the same reference symbols, and detailed descriptions thereof will be omitted.

As shown in FIG. 7, the support body 3c related to the modified-form example 3 comprises a device mounting portion 31, columnar parts 32, a lateral plate 35, and a bottom plate 36. The device mounting portion 31 is a member having the main surface 31a on which the power semiconductor device 4 is to be mounted. Moreover, there are provided a plurality of columnar parts 32 that are each so formed as to jut out from the back surface 31b of the device mounting portion 31. Moreover, the lateral plate 35 is connected to the back surface 31b of the device mounting portion 31 so as to surround the plurality of columnar parts 32. Further, the bottom plate 36 is connected to the lower surfaces 32a of the plurality of columnar parts 32 and the lower surface 35a of the lateral plate 35 as well. Still further, the base body 2 is bonded to the bottom plate 36.

That is, according to the substrate for mounting the device and the package for housing the device 1c employing this substrate in accordance with the modified-form example 3, since the lower surfaces 32a of the plurality of columnar parts 32, the lower surface 35a of the lateral plate 35, and the bottom plate 36 are connected to one another and also the bottom plate 36 and the base body 2 are bonded to each other, it never occurs that heat generated from the power semiconductor device 4 is directly transmitted to the base body 2. Moreover, with the provision of the lateral plate 35 connected to the back surface 31b of the device mounting portion 31 so as to surround the plurality of columnar parts 32, as compared with the modified-form example 2, in this example, heat generated from the power semiconductor device 4 can be confined more readily in the space P1 between the columnar parts 32 (namely, a region between the device mounting portion 31 and the bottom plate 36). Moreover, according to the substrate for mounting the device and the package for housing the device 1c employing this substrate in accordance with the modified-form example 3, heat generated from the power semiconductor device 4 can be dissipated from the lateral plate 35 and the base body 2. In this way, according to the substrate for mounting the device and the package for housing the device 1c employing this substrate in accordance with the modified-form example 3, it is possible to insulate heat generated from the power semiconductor device 4 more positively than may be the case of the modified-form example 2 while dissipating the heat to a certain extent.

Modified-Form Example 4

As shown in FIG. 8, a package for housing the device 1d in accordance with a modified-form example 4 is provided with a support body 3d in lieu of the support body 3 shown in FIG. 1. Note that, in FIG. 8, the components that are similar in function to those in FIG. 3 will be identified with the same reference symbols, and detailed descriptions thereof will be omitted.

As shown in FIG. 8, the substrate for mounting the device 1d in accordance with the modified-form example 4 comprises the support body 3d having an upper surface on which the power semiconductor device 4 is to be mounted. Moreover, the base body 2 related to the modified-form example 4 is bonded to the lower surface of the support body 3d. Further, the support body 3d has a plurality of pores B formed therein. Note that, in a case where the support body 3d is made, for example, of a ceramic material, the plurality of pores B within the support body 3d are formed as follows, for example. That is, a plurality of resin beads are mixed in the ceramic material in advance. Then, the ceramic material, along with the resin beads, is fired at a predetermined temperature with consequent decomposition of the resin beads. By doing so, portions where the resin beads existed become pores B, wherefore the plurality of pores B can be formed within the support body 3d. Note that the foregoing is cited merely by way of example and there is no particular limitation to the method of forming the pores B within the support body 3d.

Thus, according to the substrate for mounting the device and the package for housing the device 1d employing this substrate in accordance with the modified-form example 4, since the plurality of pores B are formed within the support body 3d, it follows that heat generated from the power semiconductor device 4 can be readily confined in the plurality of pores B formed within the support body 3d. Moreover, according to the substrate for mounting the device and the package for housing the device 1d employing this substrate in accordance with the modified-form example 4, heat generated from the power semiconductor device 4 can be dissipated from the base body 2 bonded to the lower surface of the support body 3d. In this way, according to the substrate for mounting the device and the package for housing the device 1d employing this substrate in accordance with the modified-form example 4, it is possible to dissipate heat generated from the power semiconductor device 4 while effecting heat insulation with a simple structure.

It is preferable that, as shown in FIG. 8, the support body 3*d* is so designed that its porosity (the plurality of pores B formed within the support body 3*d*) becomes higher gradually from an area thereof on a side of the power semiconductor device 4 to an area thereof on a side of the base body 2. That is, the higher the porosity is, the lower the heat transmission property is (the less likely heat is transmitted easily). Accordingly, where the support body 3*d* is so designed that its porosity becomes higher gradually from a power semiconductor device 4-sided area of the support body 3*d* to a base body 2-sided area of the support body 3*d*, it is possible to contain heat generated from the power semiconductor device 4 in the pores B located in the base body 2-sided area of the support body 3*d*, not in the pores B located in the power semiconductor device 4-sided area of the support body 3*d*. Moreover, even if heat generated from other electronic components is transmitted through the base body 2 to the support body 3*d*, it is possible to contain the said heat in the pores B located in the base body 2-sided area of the support body 3*d*. This helps reduce the possibility that the temperature of the power semiconductor device 4 exceeds the operating temperatures.

Modified-Form Example 5

In the embodiment and the modified-form examples 1 to 4 thus far described, only the support body 3, 3*a* to 3*d* and the power semiconductor device 4 are placed inside the package for housing the device 1, 1*a* to 1*d*. However, as shown in FIG. 9, in addition to the support body 3 and the power semiconductor device 4, a base 11 and an electronic component 12 may be placed inside a package for housing the device 1*e*. The base 11 is bonded to the upper surface of the base body 2. The electronic component 12 is mounted on the upper surface of the base 11. That is, the frame body 5 is disposed on the upper surface of the base body 2 so as to surround the power semiconductor device 4 and the electronic component 12. Herein, the electronic component 12 refers, for example, to a resistor, a piezoelectric element, a quartz oscillator, a ceramic resonator, or the like. In this way, both of the power semiconductor device 4 and the electronic component 12 can be placed inside the package for housing the device 1*e*. Note that, instead of the electronic component 12, a semiconductor device (for example, an SiC-made semiconductor device, an Si-made semiconductor device, or a semiconductor device constructed by using gallium nitride, diamond, or the like) may be placed therein.

Although, in FIG. 9, there is shown the case where the support body placed inside the package for housing the device 1*e* is the support body 3 of the embodiment described above (refer to FIG. 3), the invention is not so limited. That is, the support body placed inside the package for housing the device 1*e* may be any of the support body 3*a* related to the modified-form example 1 (refer to FIG. 5), the support body 3*b* related to the modified-form example 2 (refer to FIG. 6), the support body 3*c* related to the modified-form example 3 (refer to FIG. 7), and the support body 3*d* related to the modified-form example 4 (refer to FIG. 8). Herein, in order to restrain the electronic component 12 from being affected by heat generated from the power semiconductor device 4, it is desirable to use a support body which exhibits high heat insulation property. For example, the support body 3*b* related to the modified-form example 2 or the support body 3*c* related to the modified-form example 3 is desirable for use.

Moreover, although the above description deals with the case where only a single electronic component 12 is placed inside the package for housing the device 1*e*, the invention is not so limited. That is, the number of the electronic component 12 to be placed inside the package for housing the device 1*e* can be determined arbitrarily.

Modified-Form Example 6

Figure 10:
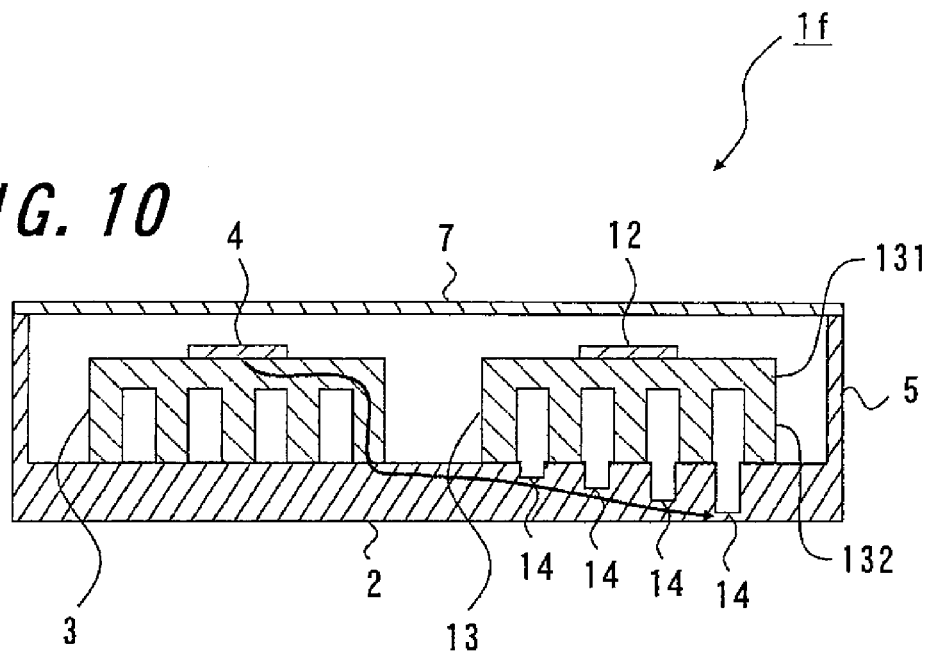
FIG. 10 is a sectional view showing one example of a package for housing a device in accordance with a modified-form example 6.

In FIG. 9 representing the above-described modified-form example 5, there is shown the example in which the base 11 has a rectangular parallelepiped shape. However, in the above-described modified-form example 5, heat generated from the power semiconductor device 4 is transmitted to the electronic component 12 through the support body 3, the base body 2, and the base 11. Therefore, the electronic component 12 is significantly affected by the heat generated from the power semiconductor device 4. This gives rise to a possibility that the electronic component 12 suffers from troubles due to the heat generated from the power semiconductor device 4. In light of this, a modified-form example 6 will be explained. In this example, as shown in FIG. 10, a notch 14 is formed in an area of the base body 2 which is located between the columnar parts 32. Note that a semiconductor device (for example, an SiC-made semiconductor device, an Si-made semiconductor device, or a semiconductor device constructed by using gallium nitride, diamond, or the like) may be used in lieu of the electronic component 12.

As shown in FIG. 10, in a device housing package if in accordance with the modified-form example 6, a base 13 comprises a flat plate-shaped electronic-component mounting portion 131 having a main surface (one surface) on which the electronic component 12 is to be mounted, and a plurality of columnar parts 132 formed so as to jut out from the back surface (the other surface) of the electronic-component mounting portion 131. Moreover, the base body 2 is bonded to the lower surfaces of the plurality of columnar parts 132.

Herein, a notch 14 is formed in an area of the base body 2 which is located between the columnar parts 32. The notches 14 are so formed as to be arranged in order of increasing depth in the direction of thickness of the base body 2 along a direction away from the power semiconductor device 4. In this way, as indicated by an arrow depicted in FIG. 10 (the route of heat), it is possible to facilitate the escape of heat generated from the power semiconductor device 4 from the base body 2 below the notches 14 to the outside of the device housing package 1*f*. Hence, according to the device housing package if in accordance with the modified-form example 6, the electronic component 12 can be restrained from being affected by the heat generated from the power semiconductor device 4.

Modified-Form Example 7

Figure 11:
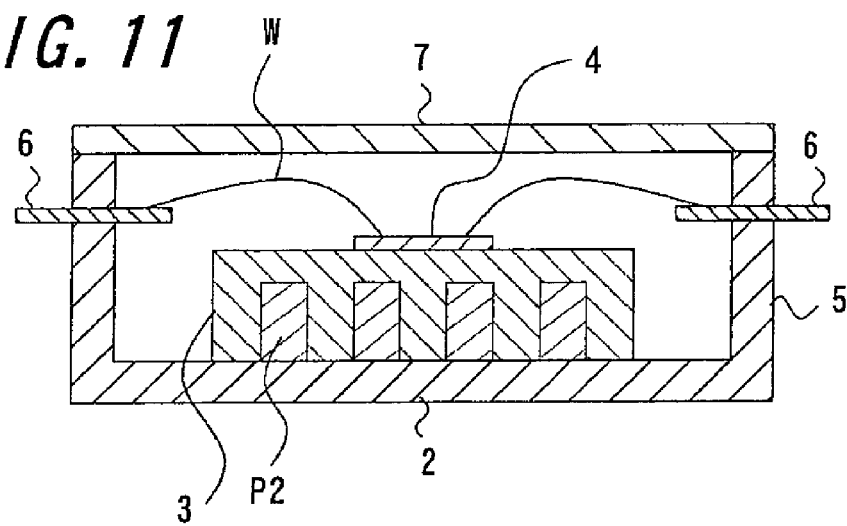
FIG. 11 is a sectional view showing one example of a package for housing a device in accordance with a modified-form example 7.

By way of the embodiment described earlier, as shown in FIG. 3, the substrate for mounting the device is described comprising the device mounting portion 31 having the main surface 31*a* on which the power semiconductor device 4 is to be mounted, the plurality of columnar parts 32 formed so as to jut out from the back surface 31*b* of the device mounting portion 31, and the base body 2 bonded to the lower surfaces 32*a* of the plurality of columnar parts 32. Even in this construction, however, depending on the type of the power semiconductor device 4, device usage, and so forth, there may be a case where heat generated from the power semiconductor device 4 is dissipated to excess. In light of this, in a device housing package 1*d* in accordance with a modified-form example 7, as shown in FIG. 11, instead of the space P1 is present between the columnar parts as shown in FIG. 1, a thermal insulating material P2 is disposed between the columnar parts. Note that, in FIG. 11, the components that are similar in function to those in FIG. 3 will be identified with the same reference symbols, and detailed descriptions thereof will be omitted.

As shown in FIG. 11, a support body 3a related to the modified-form example 7 comprises a device mounting portion 31 and columnar parts 32. The device mounting portion 31 is a member having the main surface 31a on which the power semiconductor device 4 is to be mounted. Moreover, there are provided a plurality of columnar parts 32 that are each so formed as to jut out from the back surface 31b of the device mounting portion 31. Moreover, a bottom plate 33 is connected to the lower surfaces 32a of the plurality of columnar parts 32. Further, the base body 2 is bonded to the bottom plate 33. Still further, the thermal insulating material P2 is disposed between the columnar parts 32.

The thermal insulating material P2 is made of a material which is lower in thermal conductivity than the columnar part 32. The thermal insulating material P2 is made, for example, of a glass material, a highly heat-resistant resin material, or the like that has been processed into a fiber form or a bubble-bearing form. For example, the thermal conductivity of the thermal insulating material P2 is set to fall within a range of 0.02 W/(m·K) or above and 2 W/(m·K) or below.

Thus, according to the substrate for mounting the device and the package 1a for housing the device employing this substrate in accordance with the modified-form example 7, since the thermal insulating material P2 is disposed between the adjacent ones of the plurality of columnar parts 32, it never occurs that heat generated from the power semiconductor device 4 is directly transmitted to the base body 2. Therefore, as compared with the preceding examples, heat generated from the power semiconductor device 4 can be confined more readily in the thermal insulating material P2 between the columnar parts 32 (namely, a region between the device mounting portion 31 and the bottom plate 33). Hence, according to the substrate for mounting the device and the package for housing the device 1a employing this substrate in accordance with the modified-form example 1, it is possible to keep heat generated from the power semiconductor device 4 within the package for housing the device 1a more reliably than may be the case of the preceding embodiment.

The invention claimed is:

1. A package for housing a device comprising:
   a substrate for mounting a device comprising: a support body having, on one main surface of the support body, a device mounting portion for mounting a power semiconductor device, the support body having a plurality of columnar parts that are spaced apart in a thickness direction with respect to the mounting portion and are arranged apart from each other; and a heat accumulating region which is disposed between the columnar parts and is lower in thermal conductivity than the support body;
   a frame body which accommodates therein the substrate and is so placed as to surround the power semiconductor device;
   a base which is provided within the frame body and on which an electronic component is to be mounted; and
   a lid body bonded to an upper surface of the frame body,
   each of the columnar parts including a bottom face bonded to the base and a side face which is entirely exposed to the heat accumulating region.

2. The package for housing the device according to claim 1, wherein a thermal insulating material is disposed between the columnar parts.

3. The package for housing the device according to claim 2, wherein the thermal insulating material is lower in thermal conductivity than the columnar part.

4. The package for housing the device according to claim 1, wherein the support body further includes a surrounding portion formed so as to surround the plurality of columnar parts.

5. The package for housing the device according to claim 1, wherein the power semiconductor device is a semiconductor device comprising SIC.

6. An electronic apparatus comprising:
   the package according to claim 1; and
   the power semiconductor device and an electronic component which are housed in the package.

* * * * *